(12) United States Patent
Planche et al.

(10) Patent No.: US 11,403,737 B2
(45) Date of Patent: Aug. 2, 2022

(54) SEGMENTING AND DENOISING DEPTH IMAGES FOR RECOGNITION APPLICATIONS USING GENERATIVE ADVERSARIAL NEURAL NETWORKS

(71) Applicant: Siemens Aktiengesellschaft, Munich (DE)

(72) Inventors: Benjamin Planche, Princeton, NJ (US); Sergey Zakharov, Kirchseeon (DE); Ziyan Wu, Princeton, NJ (US); Slobodan Ilic, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 143 days.

(21) Appl. No.: 16/756,530

(22) PCT Filed: Nov. 5, 2018

(86) PCT No.: PCT/US2018/059191
§ 371 (c)(1),
(2) Date: Apr. 16, 2020

(87) PCT Pub. No.: WO2019/090213
PCT Pub. Date: May 9, 2019

(65) Prior Publication Data
US 2020/0294201 A1  Sep. 17, 2020

Related U.S. Application Data

(60) Provisional application No. 62/581,282, filed on Nov. 3, 2017.

(51) Int. Cl.
*G06T 5/00* (2006.01)
*G06T 7/55* (2017.01)
(Continued)

(52) U.S. Cl.
CPC .............. *G06T 5/002* (2013.01); *G06F 30/23* (2020.01); *G06F 30/27* (2020.01); *G06N 3/08* (2013.01);
(Continued)

(58) Field of Classification Search
None
See application file for complete search history.

(56) References Cited

U.S. PATENT DOCUMENTS 10,937,141 B2 * 3/2021 Song ...................... G06N 3/084
11,024,013 B2 * 6/2021 Halupka ............... G06N 3/0472
(Continued)

OTHER PUBLICATIONS

Zhao, G., Liu, J., Jiang, J. et al. A deep cascade of neural networks for image inpainting, deblurring and denoising. Multimed Tools Appl 77, 29589-29604 (2018). https://doi.org/10.1007/s11042-017-5320-7 (Year: 2018).*
(Continued)

*Primary Examiner* — Andrae S Allison

(57) ABSTRACT

A method of removing noise from a depth image includes presenting real-world depth images in real-time to a first generative adversarial neural network (GAN), the first GAN being trained by synthetic images generated from computer assisted design (CAD) information of at least one object to be recognized in the real-world depth image. The first GAN subtracts the background in the real-world depth image and segments the foreground in the real-world depth image to produce a cleaned real-world depth image. Using the cleaned image, an object of interest in the real-world depth image can be identified via the first GAN trained with synthetic images and the cleaned real-world depth image. In an embodiment the cleaned real-world depth image from the first GAN is provided to a second GAN that provides additional noise cancellation and recovery of features removed by the first GAN.

19 Claims, 5 Drawing Sheets

(51) Int. Cl.
  *G06T 7/194* (2017.01)
  *G06F 30/23* (2020.01)
  *G06F 30/27* (2020.01)
  *G06N 3/08* (2006.01)

(52) U.S. Cl.
  CPC ............. *G06T 7/194* (2017.01); *G06T 7/55* (2017.01); *G06T 2207/10028* (2013.01)

(56) References Cited

U.S. PATENT DOCUMENTS

| | | | |
|---|---|---|---|
| 2018/0240219 A1* | 8/2018 | Mentl | G06N 3/08 |
| 2020/0167161 A1* | 5/2020 | Planche | G06F 9/328 |
| 2021/0201078 A1* | 7/2021 | Yao | G06K 9/6257 |
| 2021/0256353 A1* | 8/2021 | Nilsson | G06F 3/013 |

OTHER PUBLICATIONS

International Search Report dated Feb. 14, 2019; International Application No. PCT/US2018/059191; 17 pages.

Jie Li et al: "WaterGAN: Unsupervised Generative Network to Enable Real-time Color Correction of Monocular Underwater Images", Arxiv.org, Cornell University Library,, Feb. 23, 2017 (Feb. 23, 2017), XP080748369 / Feb. 23, 2017.

Kiana Ehsan et al: "SeGAN: Segmenting and Generating the Invisible", Arxiv.org, Cornell University Library, 201, Mar. 29, 2017 (Mar. 29, 2017), pp. 1-10, XP080753049 / Mar. 29, 2017.

Zhang Xin et al: "Fast depth image denoising and enhancement using a deep convolutional network", 2016 IEEE International Conference on Acoustics, Speech and Signal Processing ( ICASSP), Mar. 20, 2016 (Mar. 20, 2016), pp. 2499-2503, XP032901053 / Mar. 20, 2016.

Konstantinos Bousmalis et al: "Unsupervised Pixel-Level Domain Adaptation with Generative Adversarial Networks", Arxiv.org, Cornell University Library, 201 Olin Library Cornell University Ithaca, NY 14853, pp. 1-15, XP080744869; DOI: 10.1109/CVPR.2017.18; the whole document / Dec. 16, 2016.

Costa et al., "Towards Adversarial Retinal Image Synthesis", Jan. 31, 2017, pp. 1-11.

Divakar Nithish et al: "Image Denoising via CNNs: An Adversarial Approach", 2017 IEEE Conference on Computer Vision and Pattern Recognition Workshops (CVPRW), Jul. 21, 2017 (Jul. 21, 2017), pp. 1076-1083, XP033145887 / Jul. 21, 2017.

* cited by examiner

SEGMENTING AND DENOISING DEPTH IMAGES FOR RECOGNITION APPLICATIONS USING GENERATIVE ADVERSARIAL NEURAL NETWORKS

CROSS-REFERENCE TO RELATED APPLICATIONS

This application is a national phase filing under 35 U.S.C. § 371 of International Patent Application No. PCT/US2018/059191, filed Nov. 5, 2018, which claims the benefit of priority to U.S. Provisional Patent Application Serial No. 62/581,282 filed Nov. 3, 2017 entitled, "Segmenting and Denoising Depth Images for Recognition Applications Using Generative Adversarial Neural Networks", which are incorporated by reference herein in their entirety.

TECHNICAL FIELD

This application relates to imaging. More particularly, the application relates to automated recognition of objects in an image.

BACKGROUND

As machine automation continues to develop, one important aspect is to recognize the presence and state of objects in proximity to operations. For example, image sensors that detect optical information, including depth information may be used to capture images of regions of a plant. A human viewing the images may easily recognize objects in the image based on prior knowledge. However, it is not as simple to have a machine "view" the images and identify objects in the image. Various factors, including environmental conditions, the condition of the sensors, the orientation of the object, and additional unimportant objects captured in the background or foreground of the image create variations in the captured images that make it difficult to teach a machine how to make these determinations.

To recognize specific objects, pre-existing images of those objects may be presented to a machine learning network, which can then classify objects in a captured image with the training data the network has previously been given access to. To reduce the time and expense of generating and annotating real-world images for training the neural networks, methods have been developed which generate synthetic images of the objects from three dimensional (3D) computer aided design (CAD) data. Discrepancies (noise, cluttering, etc.) between the synthetic depth images often used for the training of recognition methods, and the target real-world depth scans must be addressed to achieve accurate object recognition. This gap between the two image domains (real and synthetic) deeply affects the accuracy of the recognition algorithms.

In particular, recent progress in computer vision has been dominated by deep neural networks trained with large amount of accurately labeled data. But collecting and annotating such datasets is a tedious and in some contexts impracticable task. Accordingly, a recent focus in approaches has relied solely on synthetically generated data from 3D models for their training, using 3D rendering engines.

So far, research has been mostly focusing on bridging the realism gap by improving the generation of the synthetic depth images. We propose to tackle this problem from the opposite perspective, i.e. processing the real images in production (segmenting and enhancing) to bring them closer to the synthetic images the recognition algorithms have been trained with.

Previous work has included attempts to statistically simulate and apply noise impairing depth images. For example, a previous study proposed an end-to-end framework which simulates the whole mechanism of structured-light sensors, generating realistic depth data from three-dimensional (3D) computer assisted design (CAD) models by comprehensively modeling vital factors such as sensor noise, material reflectance, surface geometry, etc. In addition to covering a wider range of sensors than previous methods, this approach also provided more realistic data, consistently and significantly enhancing the performance of neural network algorithms for different 3D recognition tasks, when used for their training.

Other work has built on this concept by using a GAN-based process to improve the realism of the generated depth scans and apply some pseudo-realistic backgrounds to them. However, using simulated data cannot always accurately represent real-world images to train neural networks. Methods and systems that can train recognition networks using data more representative of real-world images would be beneficial.

SUMMARY

A method and system for generating realistic images for training of recognition networks includes processing the actual real-world images to be recognized to make them look like the noiseless synthetic data used to train the algorithms. 1.

A method of removing noise from a depth image comprises presenting a real-world depth image in real-time to a first generative adversarial neural network (GAN), the first GAN being trained by synthetic images generated from computer assisted design (CAD) information of at least one object to be recognized in the real-world depth image, in the first GAN, subtracting the background in the real-world depth image and in the first GAN, segmenting the foreground in the real-world depth image to produce a cleaned real-world depth image.

In some embodiments, the method may further include identifying an object of interest in the real-world depth image via the first GAN and the cleaned real-world depth image. In other embodiments, the method further includes providing the cleaned real-world depth image to a second GAN to provide additional noise cancellation and recovery of some features removed by the first GAN. When training the first GAN, the synthetic images used to train the GAN may be augmented by adding simulated distortion to the synthetic images. In addition, random background elements are added to the synthetic image used to train the first GAN.

When training the GAN, training data may be in the form of real pairs of images comprising the cleaned real-world depth image and a synthetic image having no noise and no background stacked to create a real pair and in the form of real pairs of images comprising the cleaned real-world depth image and an image from the output of the first GAN stacked to create a fake pair.

When augmenting the synthetic images, the distortion added may include a linear transform of a target object in the synthetic image, combining random background data into the synthetic image or inserting an object into the synthetic image that at least partially occludes a target object in the synthetic image.

The first and second GAN may be implemented in any GAN architecture, including by not limited to an Image-to-Image GAN architecture or a U-Net GAN architecture.

A system for removing noise from a captured real-world depth image includes a first generative adversarial neural network (GAN), the first GAN being trained with synthetic images derived from three-dimensional computer assisted drafting (CAD) information for a target object to be recognized in the capture real-world depth image, wherein the first GAN is configured to receive the real-world depth image and output a cleaned image to resemble one of the synthetic images and a second GAN configured to receive an output of the first GAN, the second GAN being trained with the synthetic images used to train the first GAN, wherein the second GAN operates to fine tune the cleaning of the real-world depth image, including removing additional noise from the cleaned depth image or restoring features of the target object.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Figure 1:
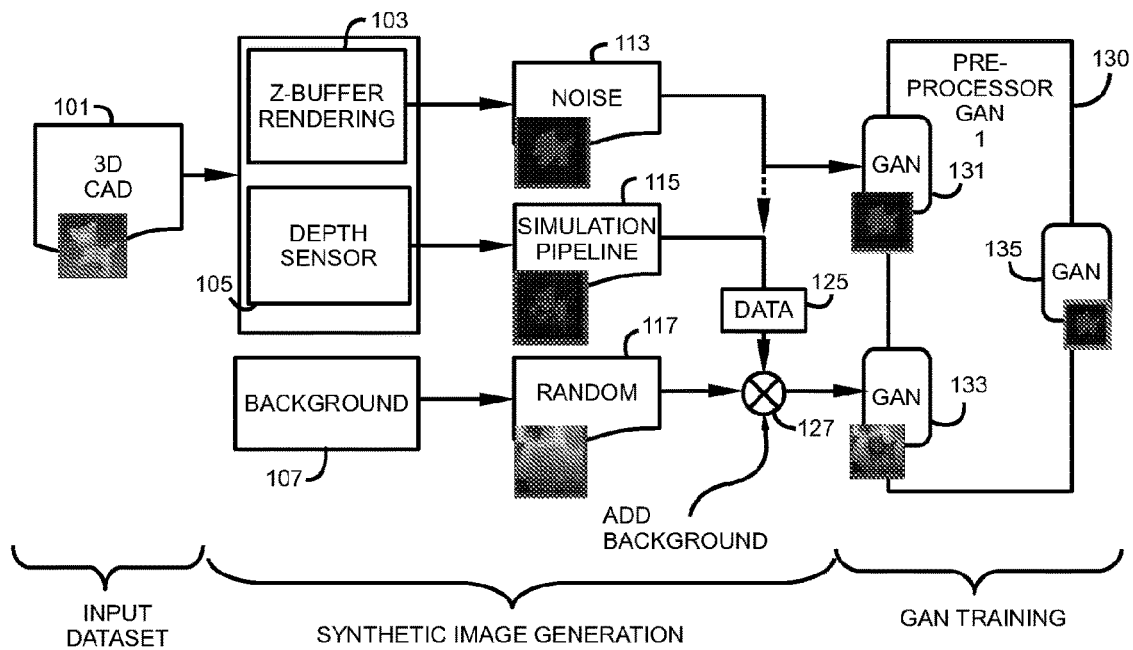
FIG. 1 is a block diagram for training a first GAN according to embodiments of this disclosure.

A method and system to improve depth-based recognition applications by preprocessing input depth data to extract and denoise the foreground, facilitates further operations (e.g. object recognition, pose estimation, etc.). This preprocessing is done by applying real-time segmentation, which may be followed by smoothing the depth images using generative adversarial neural networks purely trained over synthetic data.

Recent advances in computer vision are dominated by deep neural networks trained with a large amount of accurately labeled data. Collecting and annotating such datasets is a tedious, and in some contexts impracticable task. Therefore, many recent approaches rely solely on synthetically generated data from 3D models for their training, using 3D rendering engines. For depth images however, discrepancies between the modeled images with real scans noticeably affect the performance of these approaches.

To this point, research has mostly focused on bridging the gap between modeled and real-world images by improving the generation of synthetic depth images used to train the neural networks. According to embodiments described herein, this problem is approached from the opposite perspective. That is, processing the real-world depth images in production (by segmenting and enhancing) to bring the real-world images closer to the modeled synthetic images that the recognition algorithms are trained with. Previous approaches attempt to statistically simulate and apply noise impaired depth images. One study proposed an end-to-end framework to simulate the whole mechanism of structured-light sensors, generating realistic depth data from 3D CAD models by comprehensively modeling relevant factors such as sensor noise, material reflectance, surface geometry, etc. Aside from covering a wider range of sensors than previous methods, this approach resulted in more realistic data, consistently and significantly enhancing the performance of neural network algorithms for different 3D recognition tasks, when used for their training. In other work, this simulation pipeline is extended by using a GAN-based process to improve the realism of the generated depth scans and apply some pseudo-realistic backgrounds to the modeled depth images.

According to embodiments of the present invention, the problem is considered from an opposite point of view. Rather than attempting to generate realistic images used to train the recognition methods in order to allow the recognition techniques to deal with real images afterwards, methods and systems herein process the real-world depth images to be recognized. This processing makes the images appear similar to the noiseless synthetic data that was used to train the algorithms. To achieve this, the real scans are passed through deep generative adversarial neural networks (GANs) that are trained to map the real-world depth images to the corresponding synthetic modeled images.

In addition to this inversion of the real image discrepancy problem, a key contribution to solving the problem is the adoption of a depth sensor simulation pipeline in combination with an extensive data augmentation procedure to generate realistic and challenging synthetic data for the training of segmenting/denoising GAN(s). This solution does not rely on the availability of real images and their ground-truth information (unlikely to be available in many industrial applications), which provides a real advantage. Furthermore, it can be demonstrated that GANs trained using these novel techniques fare well when used after training to preprocess real-world scans. According to some embodiments an additional contribution may be achieved through the use of the optional use of two consecutive GANs (a first one for segmentation and partial denoising and a second one to refine the results).

According to an embodiment, a solution to generate segment and denoise the foreground of depth images applies generative adversarial neural networks (GANs) trained to map realistic scans to noiseless uncluttered ones. The pipeline includes a primary GAN trained to subtract the background and segment the foreground to partially denoise the results and recover some missing parts. Optionally, a second GAN is trained to further denoise and recover based on the results of the first process. Both GANs are trained only on synthetic data generated from the 3D models of the target objects. Accordingly, the solution is highly adaptive and easily deployable. By making real scans appear like synthetic images, the accuracy of recognition methods trained on synthetic data is improved, aiding in closing the discrepancy bridge experienced in the present state of the art.

The proposed method doesn't require real-world depth images and their ground-truth information, which are usually tedious if not impossible to obtain. The solution can be trained over realistic modeled images generated by an enhanced sensor simulation pipeline that simulates sensor noise and environmental factors. The pipeline is configured to generate the following from 3D models: 1) depth images with realistic noise and realistic or random background (input of the first GAN); and 2) the equivalent images without noise and background (same viewpoint, clean depth—target of the both GANs).

In addition to the use of a sensor simulation pipeline to obtain realistic training data, an extensive data augmentation procedure is used online when feeding the training images to the GANs. Every iteration, the input images undergo a series of random transformations such as background noise, foreground object distortion, random occlusions, small linear transformations (e.g. translation). This randomized procedure makes the training data much more challenging for the GANs and compensates for possible biases of the simulation pipeline.

According to an embodiment, the solution uses two GANs, each made of two deep convolutional neural networks (CNNs). A first generator network is trained to take as input a real depth scan and to return an image that resembles a synthetic image, using synthetic images as targets during training of the first generator network (performing image-to-image translation/style transfer) A second discriminator network learns to classify between real and synthesized pairs of images, and evaluates the results of the first network. The pair of GANs use standard architectures for their networks (e.g., DCGAN/Image-to-image translation GAN) edited to process multi-channel, depth images (e.g., 16 bpp).

The first, primary or generator GAN is trained to segment the foreground out of the input real images and then to smoothen or recover the object shape. This is done by trying to map realistic images to their background-less, noiseless equivalent. In other words, rather than trying to provide simulated training data to closely approximate real-world conditions, this approach starts with the real-world images and attempts to transform them to resemble the images modeled from the CAD data that are used to train the GAN.

The second GAN may be considered optional and is trained to map the images output by the first GAN again to their corresponding noiseless modeled images (also background-less). In this way the second GAN may focus on further smoothing and recovering the target objects in the image. The second GAN does not need to learn the segmentation already done by the first GAN.

Optionally, real depth scans may be used to fine-tune the method. For each real-world image, a 3D model of its foreground and the viewpoint information is needed as ground-truth. Using the simulation pipeline, a noiseless image of the foreground from the same viewpoint can thus be generated. This synthetic image is used both 1) as a mask to crop the foreground out of the real image, obtaining a background-less real scan which will be used as a target of the first GAN as well as an input to the second GAN; and 2) as the target image of the second GAN.

A method for cropping and removing noise from captured depth scans is described here and comprises two main steps:

1. The use of a generative adversarial neural network (GAN) to extract the foreground out of the input real scans, and partially smoothen the results while recovering part of the object's shape; and 2. The use of an optional second GAN to further cancel the sensor noise and fill the missing parts of the foreground.

Figure 3:
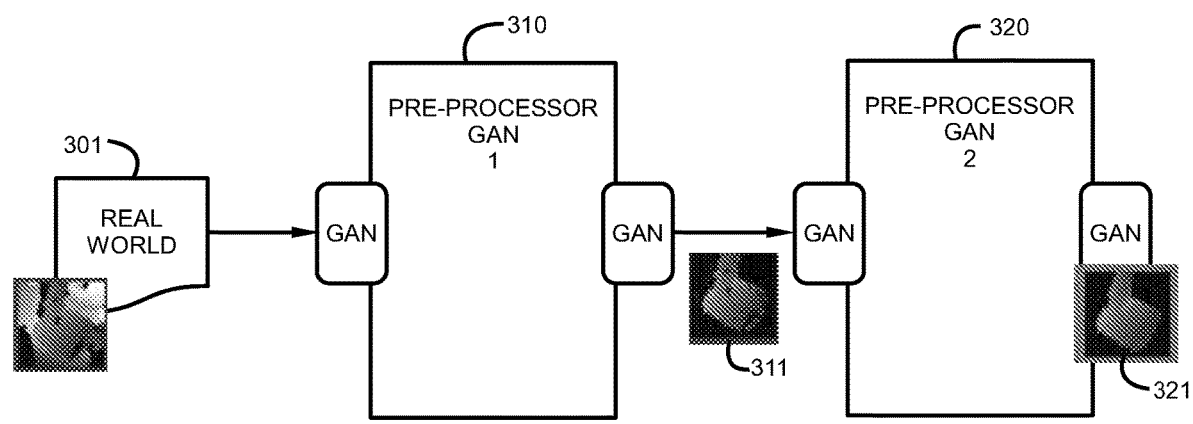
FIG. 3 is a block diagram of a pipelined method for processing a real-world depth image according to aspects of embodiments of this disclosure.

FIG. 3 is a block diagram of a method for cropping and removing noise from captured depth image scans according to an embodiment of the present invention. Real-world depth images 301 are captured and used as input to a first pre-processor GAN 310. Pre-processor GAN 1 is trained using synthetic images that are derived from information contained in CAD files that contain the design of the object in the image scans. Using these synthetic images as a target, pre-processor GAN 1 outputs a cleaned image 311 representative of the real-world image 301, cropped and with background and foreground noise removed. A second GAN 320 may be added to receive the cleaned images 311 output from the first GAN 310. The second GAN 320 is also trained using the synthetic images generated from 3D CAD information and serves to fine tune the output image 311 from the first stage and further clean or restore elements of the object in a fine-tuned output image 321. The fine-tuned output image 321 may be used in other processing including object recognition applications or pose estimation for the object.

Figure 9:
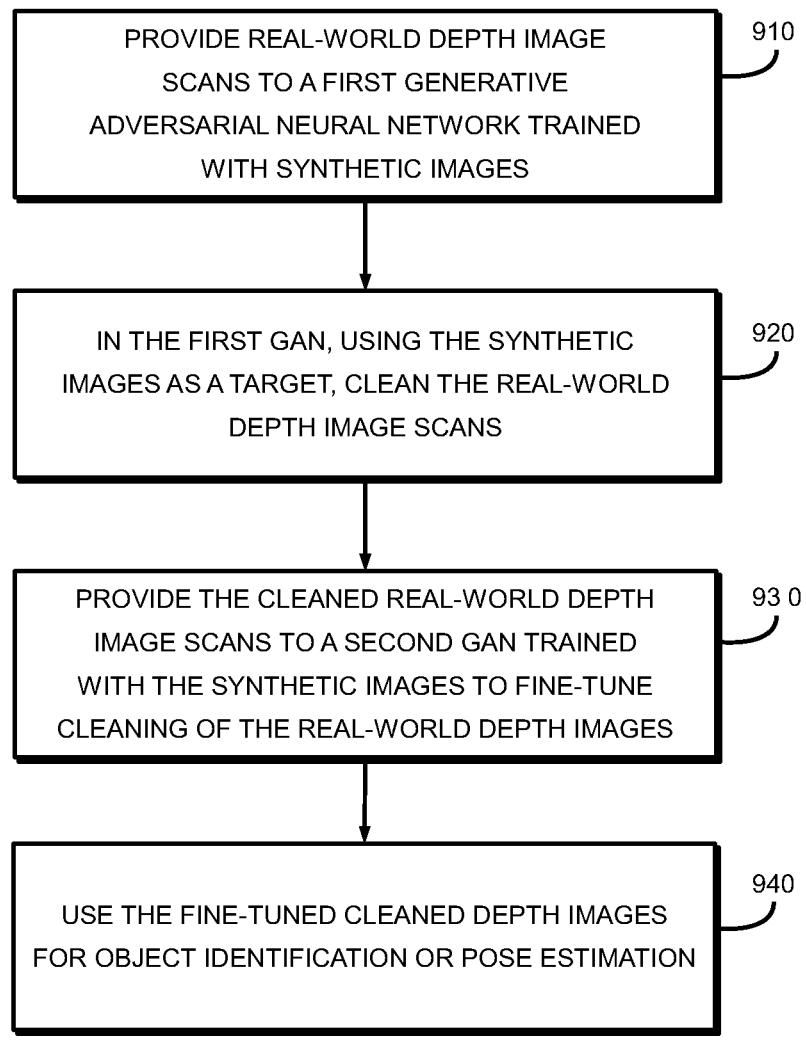
FIG. 9 is a process flow diagram for a method of cleaning real-world depth images to resemble synthetic training data according to aspects of embodiments of this disclosure.

FIG. 9 is a process flow diagram for a two stage cleaning process for captured real-world depth images according to an embodiment of the present invention. In a first step, real-world depth image scans are provided to a first GAN 910 that is trained with synthetic images generated from 3D CAD information for the object to be recognized. The real-world depth images are cleaned using the first GAN to produce a cleaned depth image 920. The images cleaned by the first GAN may be provided to a second GAN trained by the synthetic images, which fine tunes the cleaning of the real-world depth images to produce fine-tuned cleaned images 930. The second GAN may provide additional noise reduction or feature restoration to the output images that fine tunes the process of the first GAN. The fine-tuned cleaned depth images output by the second GAN may then be used for other applications, such as object recognition or pose estimation of the objects captured in the original real-world depth images.

Once trained using the chosen rendering method, the whole pipeline smoothly chains the different steps, processing in real-time the depth images which can be used as input to recognition algorithms trained on synthetic data from the same rendering process.

Now the details of each step and the accompanying training process will be described.

A preprocessing GAN is used as the first or primary GAN. In order to train the primary GAN, the following requirements must be met. For training, the first GAN requires:

A 3D model of each object of the target dataset;

A rendering pipeline configured to simulate a target sensor, generating realistic depth images;

One or more background generation methods (e.g. simplex noise, patches from depth scenes and the like).

The architecture for the primary GAN may be selected from the following options. In preferred embodiments, the following two GAN architectures are chosen to generate a cleaner, uncluttered image from the input real-world image. While these two architectures may be used depending the target use-case, it is possible that other GAN architectures may be considered and fall within the scope of this disclosure.

Image-to-Image GAN

A standard image-to-image GAN architecture and its loss function may be used for the primary GAN. The architecture of the discriminator (second GAN) network follows the DCGAN architecture: a deep convolutional network with Leaky ReLUs and sigmoid activation for output. It takes as input the original realistic image, and either the target noiseless background-less one ("real" pair) or the output from the generator (first GAN) ("fake" pair), stacked into a single image. Since the role of the discriminator is to identify the "fake" pairs from the "real" ones, the activation layer represents its deductions, each activation of this layer representing the discriminator's guess for a patch of the input data. A binary cross entropy loss function is used.

As a second option, the generator (first GAN) neural network, a U-Net architecture is used with the original real-world depth data as input, and the generator's activation layer returning a cropped image. To train the generator to make the input data similar to the target real-world data and to fool the discriminator, the generator's loss function is a combination of a cross entropy evaluation of the output and target images, and the reversed discriminator loss. Both networks are edited to process depth images (16 bpp).

Image-to-Image GAN Extended with Task-Specific Loss

In some embodiments, the previous architecture solution may be extended by considering the target recognition network while training the GAN. This task-specific method is trained on synthetic data and may be used as another "pseudo-discriminator" during the training of the GAN using a fixed task-specific network.

The images from the generator are given to the trained (fixed) recognition network, to compare the output of this network to the ground-truth noiseless image. This distance between the 2 feature vectors/estimations (vector/estimation on the GAN output versus on the ground-truth z-buffer image) would be used as a third loss (along with the generator loss and discriminator loss) to train the generator. This permits the GAN to be more "aware" of the semantic information (e.g., the different objects' classes and poses).

This optional extension of the GAN architecture may be used when:
 The target recognition method has been trained and fixed already and includes a neural network which can easily back-propagate the task-specific loss.
 The GAN is receiving too much variation among the target objects and needs to be more aware of the objects' class information to recover missing parts (e.g. for use-cases with partial occlusion).

Training

FIG. 1 shows a block diagram depicting the training of the first GAN (generator) 130 according to embodiments of the present invention. 3D CAD information 101 is used to generate synthetic images of an object to be recognized. Z-Buffer information is used for rendering 103 and noise 113 is added to simulate inconsistencies, such as sensor variations, surface geometries and light reflections off of surfaces of the object by way of example. Depth sensor information 105 is used to generate simulated views of the modeled object and are augmented using simulation pipeline 115. The simulation pipeline 115 adds information such as using a huge dataset of realistic scans generated by the simulation pipeline 113 from a multitude of different viewpoints plus optionally noiseless synthetic images 111 as well, and background 115 blended in as input, and the equivalent noiseless images without background as target, the GAN is trained to segment the foreground out. This training is taking place as follows:
 At Every iteration,
  The input images 131, 133 generated from the 3D CAD data 101 are randomly augmented by the simulation pipeline 115 to make them more challenging as described in greater detail below;
  The discriminator is trained both on a "real" pair and "fake" pair, using the latest state of the generator 130;
  The generator 130 is trained over a batch of input/target data 131, 133. Once converged, the weights of the first GAN are fixed and saved 135.

Data Augmentation

Figure 6:
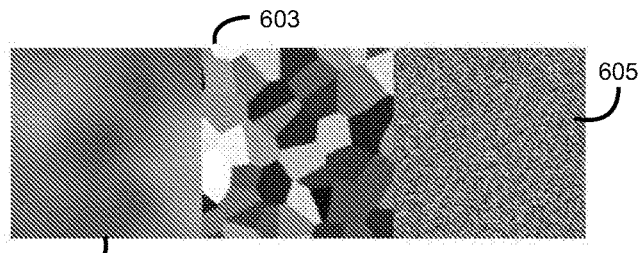
FIG. 6 is an illustration of noise types that may be used to augment training data according to aspects of embodiments of this disclosure.

Every iteration, the input images 231 (noiseless or pseudo-realistic) undergo a series of random transformations via simulation pipeline 115 such as:
 Linear Transforms (e.g. translation)
  The target objects may undergo small X-Y translations, to cover cases when detected objects aren't perfectly centered in the real images. However, it is not desired to apply linear transforms that are excessively large, or the GAN may start recognizing peripheral elements in the real images (e.g. other target objects appearing in the background).
 Background
  Random background data 117 may be generated and added to the synthetic images to provide the generator GAN 1 130 with additional basis for distinguishing objects from different background scenarios. The background information 107 may include randomly generated elements 117 that are combined 127 with the augmented synthetic image data 125 to provide augmented input images 133 to the generator GAN 130.
 Background Noise:
  In order to better simulate possible background variations, several noise types 113 are introduced in some embodiments. These noise types are often used in procedural content generation: fractal Perlin noise, cellular noise and white noise. FIG. 6 is a visual depiction of these noise types shown Perlin 601, cellular 603 and white 605 noise types. These noise patterns are generated using a vast frequency range further increasing the number of possible background variations.
 Foreground Object Distortion:
  Perlin noise generator is used to create two vector fields. The first field represents the X component of the vector, whereas the second one represents the Y component. Then, the inverse warping procedure is used to generate a warped image by treating the stored vectors as offset values for each pixel of the original image. Since noise values range span the [−1; 1] range by design, we introduce a multiplication warping factor, which allows for more severe distortions.

Figure 7:
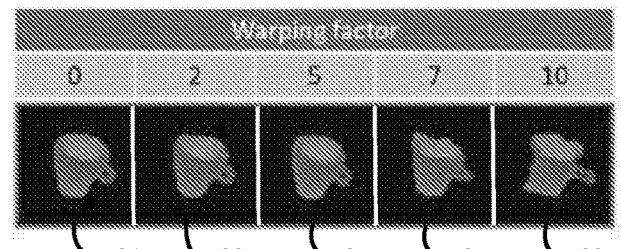
FIG. 7 is an illustration of the use of a warping factor on target objects according to aspects of embodiments of this disclosure.

FIG. 7 is an illustration of an image as the image is subjected to the multiplication warping factor. Image 701 shows an image with a warping factor of zero, image 703 shows the image when a warp factor of 2 is applied, image 705 shows the image when a warp factor of 6 is applied, image 707 shows the image when the warp factor is 8 and image 709 shows the image when the warp factor of 10 is applied to the original image.

Figure 8:
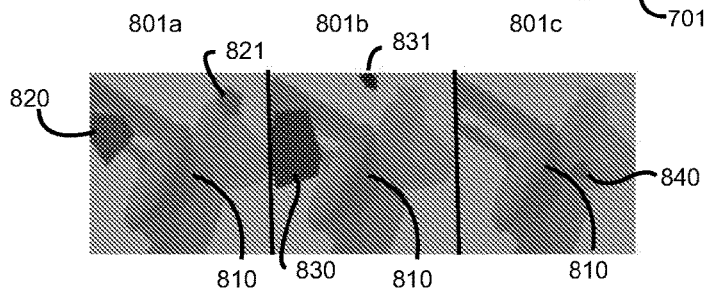
FIG. 8 is an illustration of examples of augmenting training data by inserting occluding objects relative to a target object according to aspects of embodiments of this disclosure.

Random Occlusions:

Occlusions are introduced to serve two different purposes: First is to teach a network to reconstruct the parts of the object that are partially occluded. Second purpose is to enforce the invariance to additional objects within the patch, i.e. to ignore them, treat them as a background. Occlusion objects are generated by walking around the circle taking random angular steps and random radii at each step. Then the generated polygons are filled with arbitrary depth values and painted on top of the patch This randomized procedure makes the training data much more challenging for the GANs/compensate for the possible biases of the simulation pipeline. FIG. 8 provides examples of synthetic images having partial occlusions. The three images 801*a*, 801*b* and 801*c*, depict object 810. Image 801*a* includes sample occlusions 820, 821. Image 801*b* includes different occlusions 830 and 831. Image 801*c* include object 810 and occlusion 840.

Preprocessing GAN 2

Requirements

For its training, the second GAN requires:

The 3D model of each object of the target dataset;

A rendering pipeline configured to simulate the target sensor, generating realistic depth images;

A similar or different pipeline configured to generate noiseless, clean depth images (e.g. clamped Z-buffer).

GAN Architecture

The second GAN is defined the same way as the first one, choosing between the two architectures depending on the use-cases. The exception is the loss function of the generator, its first part (comparison of the generated image with the target one) being edited to heavily penalize any change done to the background (i.e., using the input data as a binary mask+Hadamard product).

Training

Figure 2:
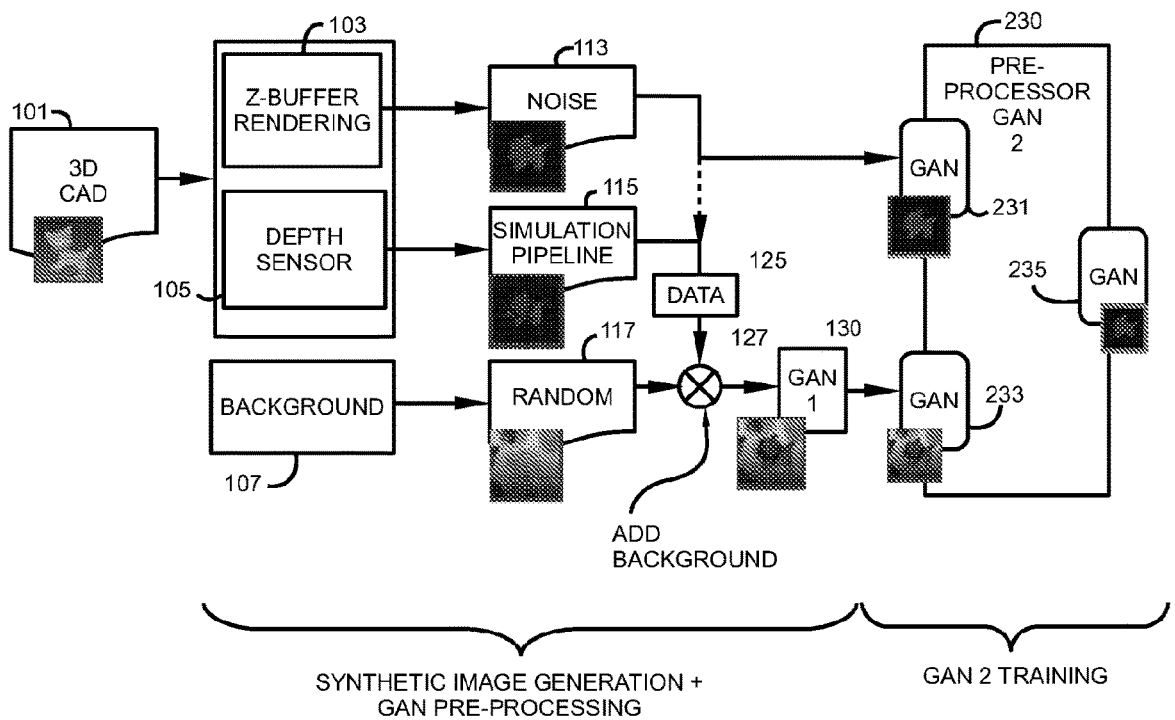
FIG. 2 is a block diagram for training a second GAN according to embodiments of this disclosure.

FIG. 2 illustrates the training of the second GAN according to embodiments of the present invention. The training of the second component is also similar to the training of the first networks, with only the input and target datasets changing, for example:

The images output by the now-fixed first GAN 130 (when given realistic augmented images as input) are used as input 232;

The background-less clean depth data 231 are used as target. Once converged, the weights of the second GAN 230 can be saved, finalizing the training of the whole pipeline 235.

Fine Tuning

If available, real depth scans can be used to fine-tune the method. For each real image, a 3D model of its foreground and the viewpoint information is needed as ground-truth. Using the 3D engine configured to generate noiseless depth images, clean images of the foreground from the same viewpoints can thus be generated. Each of these synthetic images are used both:

as a mask to crop the foreground out of the real image, obtaining a background-less real scan which will be used as target of the first GAN and input of the second GAN;

as the target image of the second GAN.

Usage

Once trained, the proposed pipeline can simply be used on every real-world depth scan containing one of the target objects to extract and clean its depth information. The result can then be used for various applications, (e.g. instance recognition or pose estimation).

Figure 4:
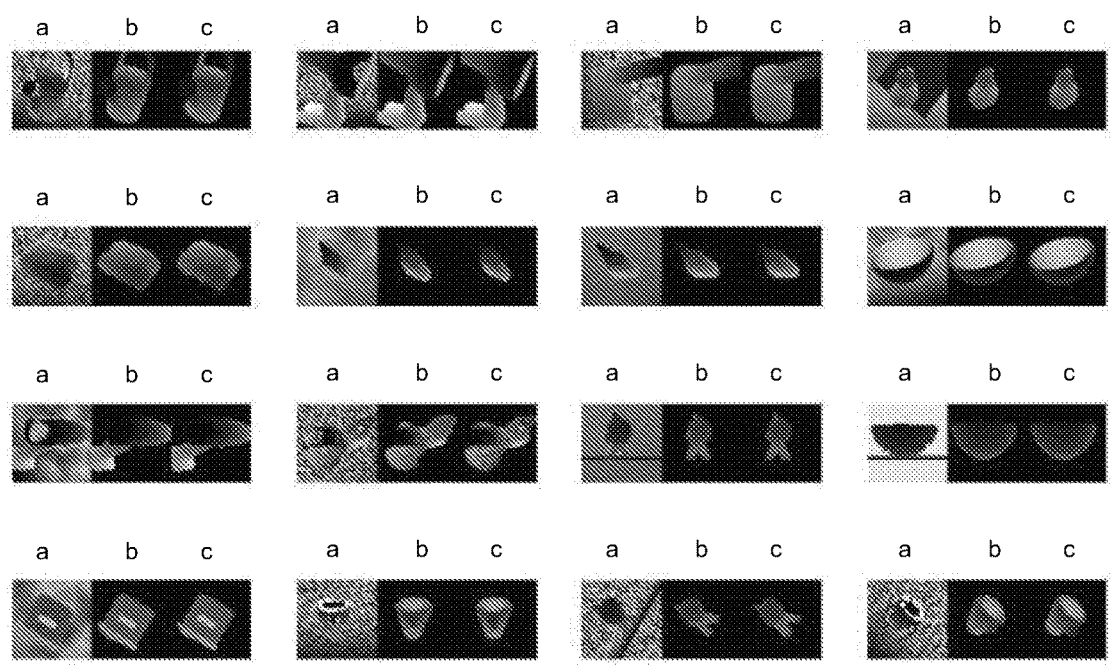
FIG. 4 is an illustration of examples of synthetic images generated during training of a first GAN according to aspects of embodiments of this disclosure.

FIG. 4 provides examples of results generated from a generator (GAN 1) each image triplet is associated with an object. Column a is the synthetic image input to GAN 1 for training, the center column b is the output of GAN 1 or the denoised and uncluttered version of a real-world depth image, and column c shows the ground-truth synthetic image (prior to noise and background added to the synthetic input images).

Figure 5:
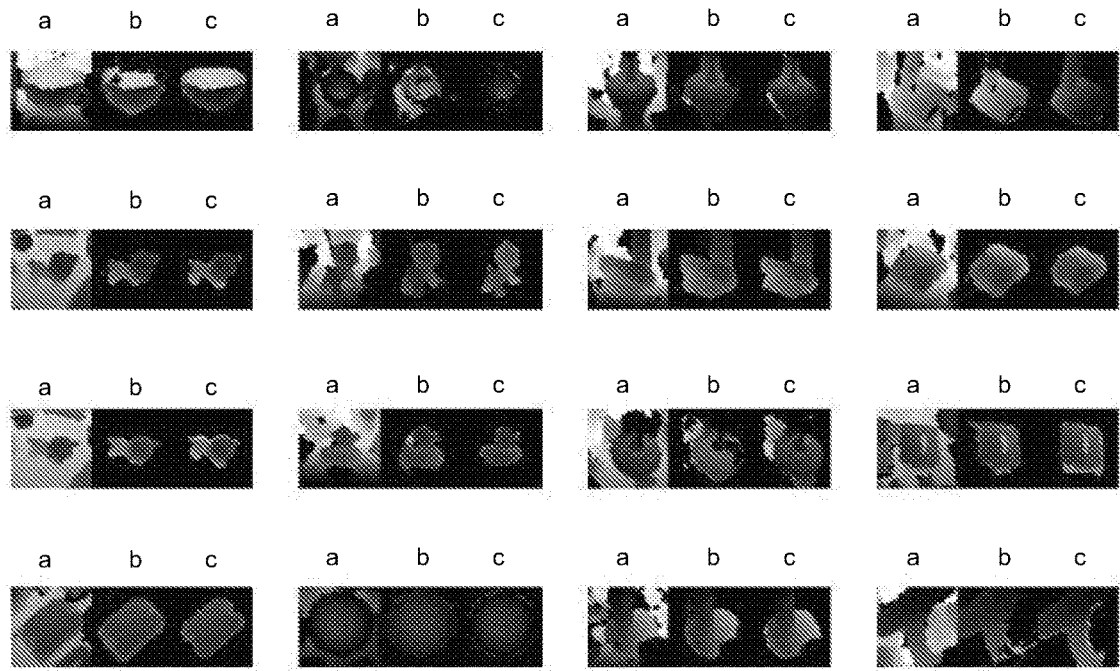
FIG. 5 is an illustration of examples of cleaned images generated by the first GAN according to aspects of embodiments of this disclosure.

FIG. 5 shows the output of GAN 1 during testing of real-world depth images. Each triplet of images corresponds to an object to be recognized. Column a represents the real-world depth image as it is captured. Center column b shows the image as it is output from the first GAN, with the background removed and the object cleaned to resemble a noiseless synthetic image of the object. Column c is ground truth for the real-world depth image when the object is cropped from the originally captured image shown in column a.

The described methods and systems represent improvements over the prior art ways of identifying objects in images such as depth imaging applications. By changing the perspective from generating simulated images to try to mimic real-world interference and noise to starting with real-world depth images and processing the images in a GAN pipeline to transform the real-world images into denoised and uncluttered images to simulate what the field of view would look like in the simulated images generated from the CAD information, more accurate object detection and pose estimation may be achieved.

Figure 10:
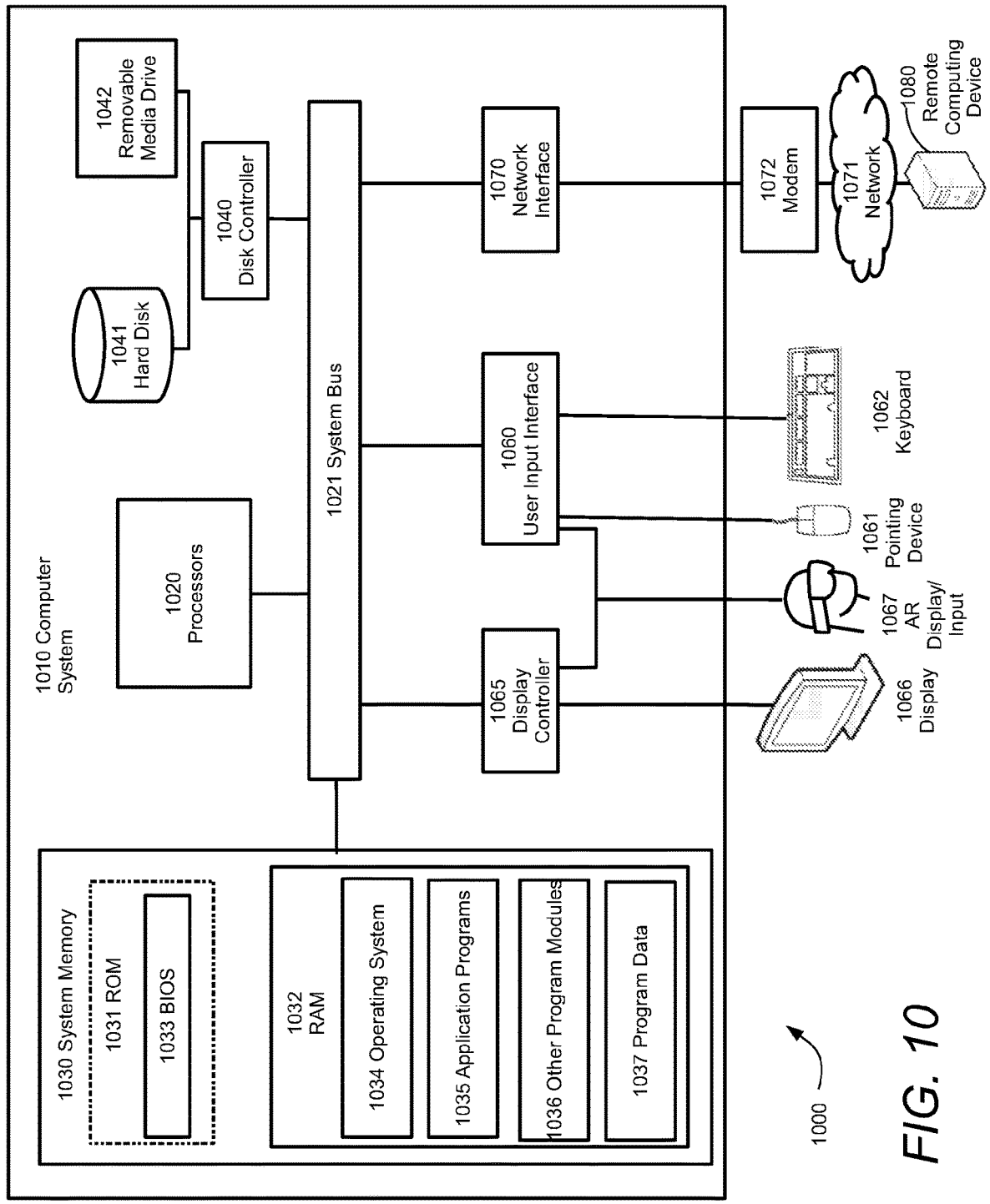
FIG. 10 is a computer system that may be used to implement aspects of embodiments described in this disclosure.

FIG. 10 illustrates an exemplary computing environment 1000 within which embodiments of the invention may be implemented. Computers and computing environments, such as computer system 1010 and computing environment 1000, are known to those of skill in the art and thus are described briefly here.

As shown in FIG. 10, the computer system 1010 may include a communication mechanism such as a system bus 1021 or other communication mechanism for communicating information within the computer system 1010. The computer system 1010 further includes one or more processors 1020 coupled with the system bus 1021 for processing the information.

The processors 1020 may include one or more central processing units (CPUs), graphical processing units (CPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 10, the computer system 1010 also includes a system memory 1030 coupled to the system bus 1021 for storing information and instructions to be executed by processors 1020. The system memory 1030 may include computer readable storage media in the form of volatile and/or nonvolatile memory, such as read only memory (ROM) 1031 and/or random access memory (RAM) 1032. The RAM 1032 may include other dynamic storage device(s) (e.g., dynamic RAM, static RAM, and synchronous DRAM). The ROM 1031 may include other static storage device(s) (e.g., programmable ROM, erasable PROM, and electrically erasable PROM). In addition, the system memory 1030 may be used for storing temporary variables or other intermediate information during the execution of instructions by the processors 1020. A basic input/output system 1033 (BIOS) containing the basic routines that help to transfer information between elements within computer system 1010, such as during start-up, may be stored in the ROM 1031. RAM 1032 may contain data and/or program modules that are immediately accessible to and/or presently being operated on by the processors 1020. System memory 1030 may additionally include, for example, operating system 1034, application programs 1035, other program modules 1036 and program data 1037.

The computer system 1010 also includes a disk controller 1040 coupled to the system bus 1021 to control one or more storage devices for storing information and instructions, such as a magnetic hard disk 1041 and a removable media drive 1042 (e.g., floppy disk drive, compact disc drive, tape drive, and/or solid state drive). Storage devices may be added to the computer system 1010 using an appropriate device interface (e.g., a small computer system interface (SCSI), integrated device electronics (IDE), Universal Serial Bus (USB), or FireWire).

The computer system 1010 may also include a display controller 1065 coupled to the system bus 1021 to control a display or monitor 1066, such as a cathode ray tube (CRT) or liquid crystal display (LCD), for displaying information to a computer user. The computer system includes an input interface 1060 and one or more input devices, such as a keyboard 1062 and a pointing device 1061, for interacting with a computer user and providing information to the processors 1020. The pointing device 1061, for example, may be a mouse, a light pen, a trackball, or a pointing stick for communicating direction information and command selections to the processors 1020 and for controlling cursor movement on the display 1066. The display 1066 may provide a touch screen interface which allows input to supplement or replace the communication of direction information and command selections by the pointing device 1061. In some embodiments, an augmented reality device 1067 that is wearable by a user, may provide input/output functionality allowing a user to interact with both a physical and virtual world. The augmented reality device 1067 is in communication with the display controller 1065 and the user input interface 1060 allowing a user to interact with virtual items generated in the augmented reality device 1067 by the display controller 1065. The user may also provide gestures that are detected by the augmented reality device 1067 and transmitted to the user input interface 1060 as input signals.

The computer system 1010 may perform a portion or all of the processing steps of embodiments of the invention in response to the processors 1020 executing one or more sequences of one or more instructions contained in a memory, such as the system memory 1030. Such instructions may be read into the system memory 1030 from another computer readable medium, such as a magnetic hard disk 1041 or a removable media drive 1042. The magnetic hard disk 1041 may contain one or more datastores and data files used by embodiments of the present invention. Datastore contents and data files may be encrypted to improve security. The processors 1020 may also be employed in a multi-processing arrangement to execute the one or more sequences of instructions contained in system memory 1030. In alternative embodiments, hard-wired circuitry may be used in place of or in combination with software instructions. Thus, embodiments are not limited to any specific combination of hardware circuitry and software.

As stated above, the computer system 1010 may include at least one computer readable medium or memory for holding instructions programmed according to embodiments of the invention and for containing data structures, tables, records, or other data described herein. The term "computer readable medium" as used herein refers to any medium that participates in providing instructions to the processors 1020 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 1041 or removable media drive 1042. Non-limiting examples of volatile media include dynamic memory, such as system memory 1030. Non-limiting examples of transmission media include coaxial cables, copper wire, and fiber optics, including the wires that make up the system bus 1021. Transmission media may also take the form of acoustic or light waves, such as those generated during radio wave and infrared data communications.

The computing environment 1000 may further include the computer system 1010 operating in a networked environment using logical connections to one or more remote computers, such as remote computing device 1080. Remote computing device 1080 may be a personal computer (laptop or desktop), a mobile device, a server, a router, a network PC, a peer device or other common network node, and typically includes many or all of the elements described above relative to computer system 1010. When used in a networking environment, computer system 1010 may include modem 1072 for establishing communications over a network 1071, such as the Internet. Modem 1072 may be connected to system bus 1021 via user network interface 1070, or via another appropriate mechanism.

Network 1071 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1010 and other computers (e.g., remote computing device 1080). The network 1071 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1071.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof.

What is claimed is:

1. A method of removing noise from a depth image comprising:
   presenting a real-world depth image in real-time to a first generative adversarial neural network (GAN), the first GAN being trained by synthetic images generated from computer assisted design (CAD) information of at least one object to be recognized in the real-world depth image;
   in the first GAN, subtracting the background in the real-world depth image;
   in the first GAN, segmenting the foreground in the real-world depth image to produce a cleaned real-world depth image.

2. The method of claim 1, further comprising:
   identifying an object of interest in the real-world depth image via the first GAN and the cleaned real-world depth image.

3. The method of claim 1, further comprising:
   providing the cleaned real-world depth image to a second GAN to provide additional noise cancellation and recovery of some features removed by the first GAN.

4. The method of claim 1, further comprising:
   training the first GAN using synthetic images generated from the CAD information, wherein the CAD information is augmented by:
   adding simulated distortion to the synthetic images.

5. The method of claim 4, further comprising:
   adding random background elements to the synthetic image used to train the first GAN.

6. The method of claim 4, wherein training the first GAN further comprises:
   providing the first GAN with training data in the form of real pairs of images comprising the cleaned real-world depth image and a synthetic image having no noise and no background stacked to create a real pair.

7. The method of claim 6, wherein training the first GAN further comprises:
   providing the first GAN with training data in the form of real pairs of images comprising the cleaned real-world depth image and an image from the output of the first GAN stacked to create a fake pair.

8. The method of claim 4, wherein adding distortion to the synthetic images comprises:
   a linear transform of a target object in the synthetic image.

9. The method of claim 4, wherein adding distorting to the synthetic images comprises:
   combining random background data into the synthetic image.

10. The method of claim 4, wherein adding distorting to the synthetic images comprises:
    inserting an object into the synthetic image that at least partially occludes a target object in the synthetic image.

11. The method of claim 1, further comprising:
    implementing the first GAN using an Image-to-Image GAN architecture.

12. The method of claim 1, further comprising:
    implementing the first GAN as a U-Net GAN architecture.

13. A system for removing noise from a captured real-world depth image comprising:
    a first generative adversarial neural network (GAN), the first GAN being trained with synthetic images derived from three-dimensional computer assisted drafting (CAD) information for a target object to be recognized in the capture real-world depth image, the CAD information augmented by adding simulated distortion to the synthetic images, wherein the first GAN is configured to receive the real-world depth image and output a cleaned image to resemble one of the synthetic images;
    a second GAN configured to receive an output of the first GAN, the second GAN being trained with the synthetic images used to train the first GAN, wherein the second GAN operates to fine tune the cleaning of the real-world depth image, including removing additional noise from the cleaned depth image or restoring features of the target object.

14. The system of claim 13, further comprising:
    the first GAN configured to identify an object of interest in the real-world depth image via the first GAN comparing a synthetic image and the cleaned real-world depth image.

15. The system of claim 13, wherein random background elements are added to the synthetic image used to train the first GAN.

16. The system of claim 13, wherein training the first GAN further comprises:
providing the first GAN with training data in the form of real pairs of images comprising the cleaned real-world depth image and a synthetic image having no noise and no background stacked to create a real pair.

17. The system of claim 16, wherein training the first GAN further comprises:
providing the first GAN with training data in the form of real pairs of images comprising the cleaned real-world depth image and an image from the output of the first GAN stacked to create a fake pair.

18. The system of claim 13, wherein adding distortion to the synthetic images comprises:
a linear transform of a target object in the synthetic image.

19. The system of claim 13, wherein adding distorting to the synthetic images comprises:
inserting an object into the synthetic image that at least partially occludes a target object in the synthetic image.

* * * * *